US011336853B2

(12) United States Patent
Bianchi et al.

(10) Patent No.: US 11,336,853 B2
(45) Date of Patent: May 17, 2022

(54) QUENCHING OF A SPAD

(71) Applicants: STMicroelectronics (Crolles 2) SAS, Crolles (FR); STMicroelectronics (Research & Development) Limited, Marlow (GB)

(72) Inventors: Raul Andres Bianchi, Myans (FR); Matteo Maria Vignetti, Aix les Bains (FR); Bruce Rae, Edinburgh (GB)

(73) Assignees: STMicroelectronics (Crolles 2) SAS, Crolles (FR); STMicroelectronics (Research & Development) Limited, Marlow (GB)

(*) Notice: Subject to any disclaimer, the term of this patent is extended or adjusted under 35 U.S.C. 154(b) by 0 days.

(21) Appl. No.: 17/063,192

(22) Filed: Oct. 5, 2020

(65) Prior Publication Data
US 2021/0105427 A1 Apr. 8, 2021

(30) Foreign Application Priority Data
Oct. 7, 2019 (FR) ...................................... 1911063

(51) Int. Cl.
*H04N 5/3745* (2011.01)
*H04N 5/378* (2011.01)

(52) U.S. Cl.
CPC ........... *H04N 5/3745* (2013.01); *H04N 5/378* (2013.01)

(58) Field of Classification Search
CPC .............................. H04N 5/3745; H04N 5/378
See application file for complete search history.

(56) References Cited

U.S. PATENT DOCUMENTS 6,384,663 B2 * 5/2002 Cova .................. G01J 1/44
250/214 A
2019/0113385 A1 * 4/2019 Fukuchi ............ H01L 27/14636

FOREIGN PATENT DOCUMENTS

EP 3 503 534 A1 6/2019

OTHER PUBLICATIONS

Berdalović et al., "Design of Passive-Quenching Active-Reset Circuit with Adjustable Hold-Off Time for Single-Photon Avalanche Diodes," MIPRO 2016, Opatija, Croatia, May 30-Jun. 3, 2016, pp. 34-39.
Gallivanoni et al., "Progress in Quenching Circuits for Single Photon Avalanche Diodes," *IEEE Transactions on Nuclear Science* 57(6):3815-3826, Dec. 2010.
Lin et al., "A photon-counting avalanche photodiode array with fully integrated active quenching and recharging circuit," Proceedings of SPIE/ IS & T, vol. 5826, Jun. 3, 2005, pp. 569-579.
Liu et al., "Reduce Afterpulsing of Single Photon Avalanche Diodes Using Passive Quenching With Active Reset," *IEEE Journal of Quantum Electronics* 44(5):430-434, May 2008.

* cited by examiner

*Primary Examiner* — Ahmed A Berhan
(74) *Attorney, Agent, or Firm* — Seed Intellectual Property Law Group LLP

(57) ABSTRACT

The present disclosure relates to a device that includes a photodiode having a first terminal that is coupled by a resistor to a first rail configured to receive a high supply potential and a second terminal that is coupled by a switch to a second rail configured to receive a reference potential. A read circuit is configured to provide a pulse when the photodiode enters into avalanche, and a control circuit is configured to control an opening of the switch in response to a beginning of the pulse and to control a closing of the switch in response to an end of the pulse.

20 Claims, 6 Drawing Sheets

Fig. 2
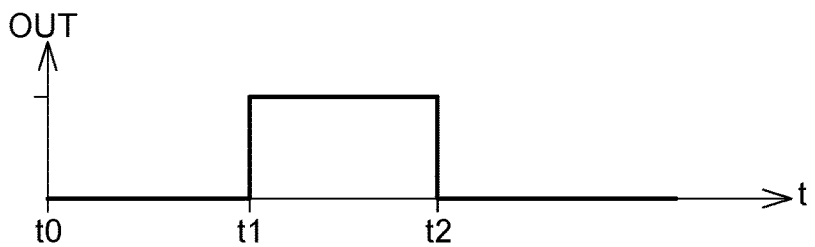
(A)
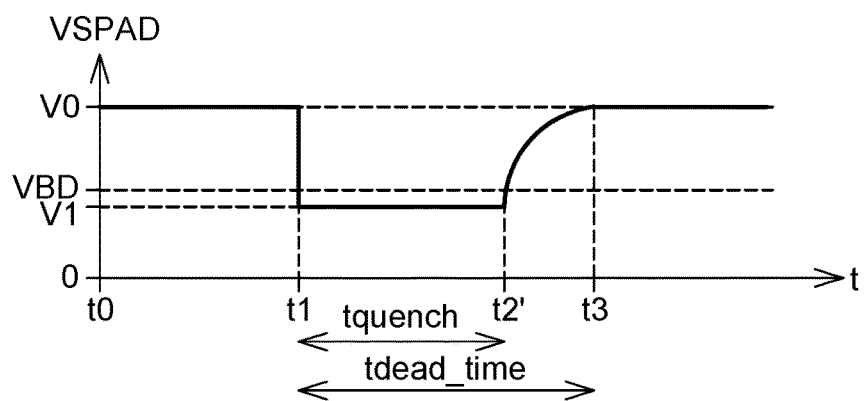
(B)
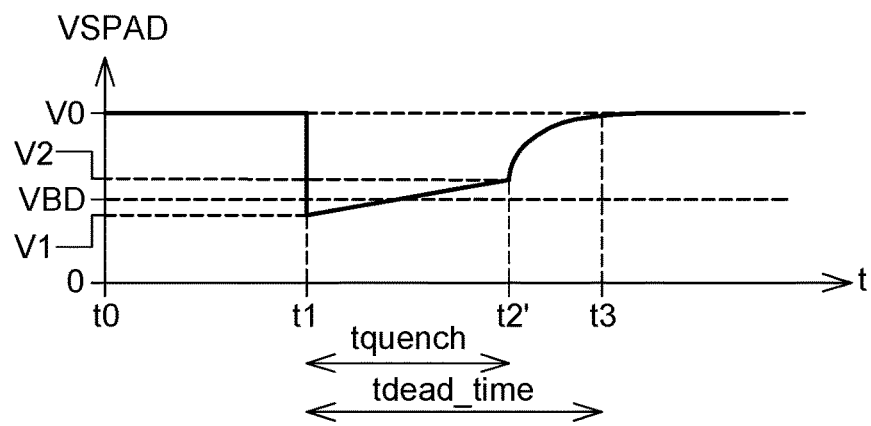
Fig. 3
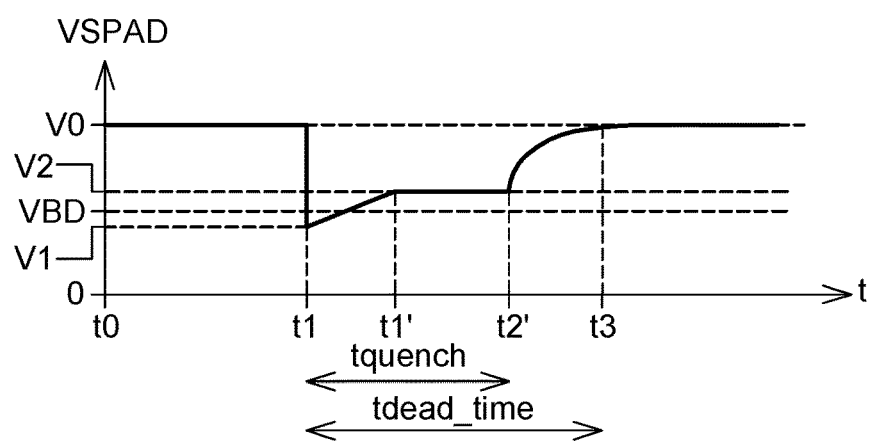
Fig. 4

QUENCHING OF A SPAD

BACKGROUND

Technical Field

The present disclosure relates generally to electronic circuits, and more specifically to SPAD or single photon avalanche diodes.

Description of the Related Art

In order to detect a single photon, a SPAD diode or photodiode is reverse biased to a voltage greater (in absolute value) than the avalanche voltage, or in other words, the diode is in Geiger condition, or in Geiger mode. In this mode, when a single photon reaches the diode, the free carriers photogenerated from this single photon are sufficiently accelerated by the electrical field present at the junction of the diode to create additional free carriers. The diode thus enters into avalanche and a current flows in the diode. In order to detect a new single photon, the diode should thus be quenched by lowering the voltage at its terminals below its avalanche voltage (as an absolute value) in order to empty the diode of its free carriers, then be placed back in Geiger condition. A quench circuit is provided for this purpose.

BRIEF SUMMARY

There is a need for a device comprising a SPAD and a quench circuit associated with the SPAD which addresses all or some of the drawbacks of the known devices comprising a SPAD and a quench circuit associated with the SPAD.

There is in particular a need for a device comprising a SPAD and its quench circuit that is compact, for example for realizing a compact image sensor comprising a plurality of these devices, for example arranged in a matrix.

There is also a need for a device comprising a SPAD and a quench circuit associated with the SPAD which makes it possible to reduce the dead time between two successive detections of single photons compared to known devices comprising a SPAD and a quench circuit associated with the SPAD.

One or more embodiments address all or some of the drawbacks of the known devices comprising a SPAD and a quench circuit associated with this SPAD.

One embodiment provides a device comprising:

a photodiode a first terminal of which is coupled by a resistor to a first rail configured to receive a high supply potential and a second terminal of which is coupled by a switch, in some embodiments a MOS transistor, to a second rail configured to receive a reference potential;

a read circuit configured to provide a pulse when the diode enters into avalanche; and a control circuit configured to control an opening of the switch in response to the beginning of said pulse and to control a closing of the switch in response to the end of said pulse.

According to an embodiment, the control circuit comprises a logic gate comprising an input configured to receive said pulse and an output configured to provide a control signal of the switch.

According to an embodiment, the control circuit is further configured to control the slope of the control signal as a function of a value of a slope adjustment potential, during a switching of the control signal causing a closing of the switch.

According to an embodiment, the control circuit comprises a MOS transistor connected between a supply terminal of the control circuit and a first supply terminal of the gate of the control circuit, a gate of the MOS transistor being configured to receive the slope adjustment potential.

According to an embodiment, the device is configured to interrupt a conductive path coupling the second terminal of the diode to the second rail via the switch for as long as a deactivation signal for deactivating the device is in a first state.

According to an embodiment:

an additional switch controlled by the deactivation signal for deactivating the device is connected in series with said switch between the second terminal of the diode and the second rail; or the gate of the control circuit comprises an input configured to receive the deactivation signal for deactivating the device.

According to an embodiment, the control circuit is further configured to keep the switch closed for as long as a deactivation signal for deactivating the control circuit is in a first state, in some embodiments, the gate of the control circuit comprising an input configured to receive the deactivation signal for deactivating the control circuit.

According to an embodiment, the control circuit comprises a MOS transistor connected between a second supply terminal of the gate of the control circuit and the second rail, a gate of the transistor being configured to receive a deactivation signal for deactivating the control circuit.

According to an embodiment, the device further comprises a capacitive bridge divider connected between the first terminal of the diode and the second rail, an input terminal of the read circuit being connected to an intermediate node of the capacitive divider bridge.

According to an embodiment, the read circuit is further configured to modify a duration of the pulse as a function of a value of a pulse-duration adjustment potential.

According to an embodiment, the read circuit comprises a MOS transistor connected between a supply terminal of the read circuit and the intermediate node, a gate of the MOS transistor being configured to receive the pulse-duration adjustment potential.

According to an embodiment, the read circuit comprises a logic gate, in some embodiments an inverter, comprising an input terminal coupled, in some embodiments connected, to the intermediate node, and an output terminal configured to provide said pulse.

According to an embodiment, the read circuit and the control circuit are each connected between the second rail and a third rail configured to receive a low supply potential.

According to an embodiment, the device further comprises a potential-limiting circuit configured to limit a maximum level of potential on the second terminal of the diode, the potential-limiting circuit may include an additional diode connected between the second terminal of said diode and a node configured to receive an intermediate supply potential.

According to an embodiment, the device further comprises a capacitor connected between the second terminal of said diode and the second rail.

Another embodiment provides an image sensor comprising a plurality of devices such as above, in some embodiments arranged in a matrix, each device may form a pixel of the sensor.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which:

FIG. 2 illustrates time charts A and B depicting the operation of an embodiment of the device shown in FIG. 1;

FIG. 3 illustrates a time chart depicting the operation of a further embodiment of the device shown in FIG. 1;

FIG. 4 illustrates a time chart depicting the operation of still a further embodiment of the device shown in FIG. 1;

DETAILED DESCRIPTION

Figure 1:
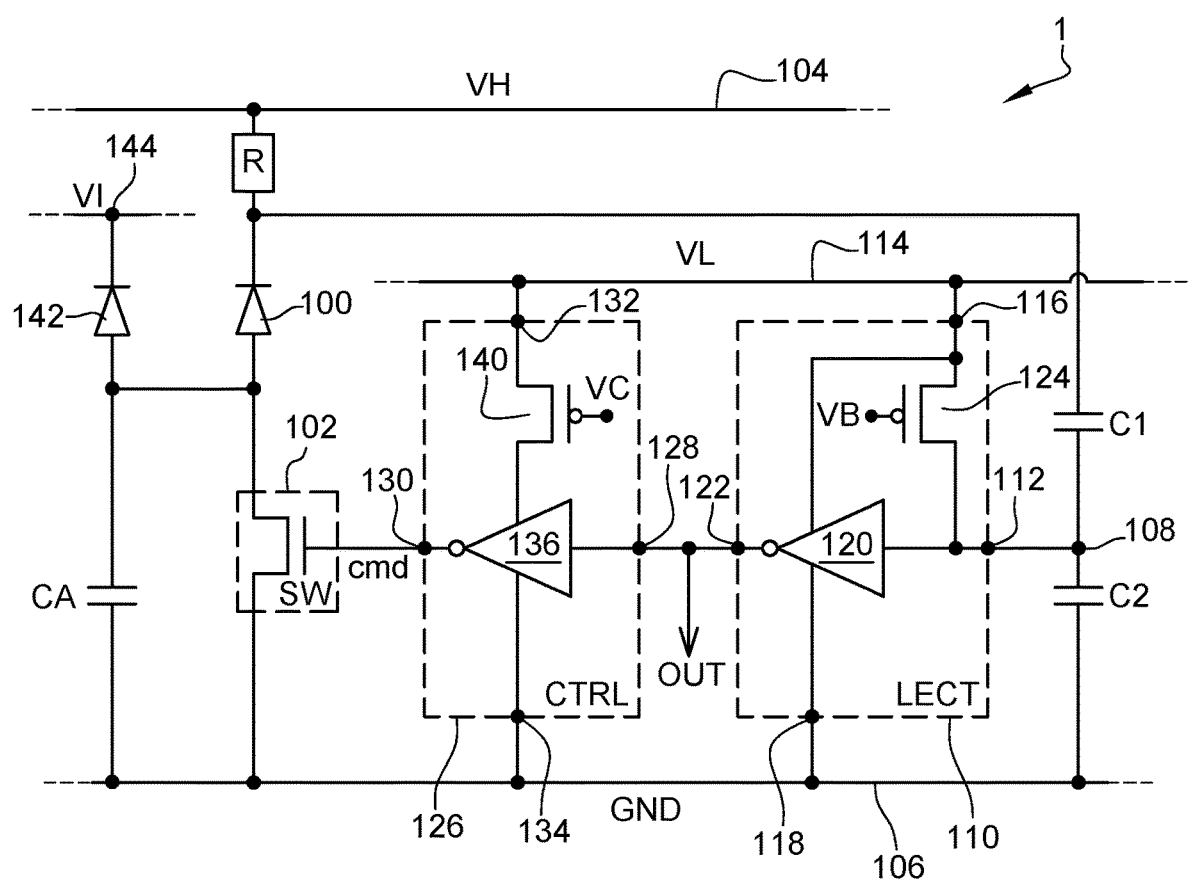
FIG. 1 illustrates, in the form of a circuit, an embodiment of a device comprising a diode adapted for use as a SPAD, and a quench circuit of the diode.

Like features have been designated by like references in the various figures. In particular, the structural and/or functional features that are common among the various embodiments may have the same references and may have identical structural, dimensional and material properties.

For the sake of clarity, only the operations and elements that are useful for an understanding of the described embodiments herein have been illustrated and described in detail. In particular, circuits for counting pulses generated by a read circuit of a SPAD at each detection of a single photon, i.e., each time the SPAD in Geiger condition enters into avalanche after having been hit by a photon, have not been described in detail, the described embodiments being compatible with conventional circuits for counting pulses. Moreover, the implementation of an image sensor comprising a plurality of devices, or pixels, each with a SPAD, has not been described in detail, the described embodiments being compatible with such conventional image sensors. More generally, the various applications where one or more SPADs are provided for detecting single photons have not been described in detail, the described embodiments being compatible with these conventional applications. Furthermore, the practical implementations of a diode adapted for use as a SPAD have not been described in detail, the described embodiments being compatible with the conventional implementations of a diode adapted for use as a SPAD.

Unless indicated otherwise, when reference is made to two elements that are connected together, this means a direct connection without any intermediate elements other than conductors, and when reference is made to two elements that are linked or coupled together, this means that these two elements can be connected or be linked or coupled by way of one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and in some embodiments within 5%.

A "digital signal" designates a signal that alternates between at least two constant states, for example between a low state, noted as "0", and a high state, noted as "1", for a "binary signal". In practice, a digital signal can correspond to a potential that is referenced with respect to a reference potential, typically ground GND, or to a current that may not be perfectly constant for a given state of the signal. In the following disclosure, a first state of a first signal can correspond to a low state of the signal while the first state of a second signal can correspond to a high state of the signal, the first states of the first and second signals thus potentially corresponding to different levels of potential.

There are two types of quench circuits, namely quench circuits of the passive type and quench circuits of the active type. A passive quench circuit comprises a resistor in series with the SPAD so that, once the avalanche in the SPAD has been triggered, the decrease in the voltage (as an absolute value) at the terminals of the SPAD results directly from the voltage drop across the resistor. An active quench circuit comprises means for reducing the voltage at the terminals of the SPAD below the avalanche voltage (as an absolute value) following the detection of an avalanche in the SPAD. In particular, an active quench circuit comprises components such as transistors, which are supplied by and/or receive potentials having values in the order of that of the voltage at the terminals of the SPAD in Geiger mode.

In the following disclosure, embodiments are described in which the beginning of the SPAD quenching process is passive, i.e., it begins directly after the voltage drop across a resistor connected in series with the SPAD. The quenching process then continues under voltage and time conditions determined by a control circuit, which also controls the phase for returning the system to its initial state.

FIG. 1 illustrates, in the form of a circuit, an embodiment of a device 1 comprising a diode 100 adapted for use as a SPAD, and a quench circuit of the diode 100.

The device 1 comprises a resistor R and a switch 102 ("SW"). The resistor R couples a first terminal of the diode 100, in some embodiments its cathode, to a first rail 104 intended to receive a high supply potential VH. In some embodiments, a terminal of the resistor R is connected to the rail 104, and a second terminal of the resistor R is connected to the cathode of the diode 100. The switch 102 couples a second terminal of the diode 100, in some embodiments its anode, to a second rail 106 intended to receive a reference potential GND, typically ground. The potential VH is referenced at ground GND. The potential VH is in some embodiments positive, for example approximately equal to 25 V.

According to an embodiment, the switch 102 is implemented by a MOS transistor 102, in some embodiments an N-channel MOS transistor. The conduction terminals of the switch 102 thus correspond to the respective conduction terminals of the transistor 102, i.e., to the drain and source terminals of the transistor 102. Moreover, a control terminal of the switch 102 thus corresponds to a control terminal, or gate, of the transistor 102.

According to the embodiment depicted in FIG. 1, the conduction terminals of the switch 102 are respectively connected to the second terminal (anode) of the diode 100 and to the second rail 106. For example, the drain of the transistor 102 is connected to the anode of the diode 100, and the source of the transistor 102 is connected to the rail 106.

The device 1 comprises a capacitive divider bridge connected between the cathode of diode 100 and the rail 106. The capacitive divider bridge comprises an intermediate node 108. The capacitive divider bridge is configured so that a variation in the cathode potential of the diode 100 causes a variation in the potential of the node 108.

In this example, the capacitive divider bridge comprises two capacitors C1 and C2 in series between the cathode of the diode 100 and the rail 106. The capacitor C1 is coupled, in some embodiments connected, to the diode 100, the capacitor C2 being coupled, in some embodiments connected, to the rail 106, and the capacitors C1 and C2 being connected to each other at the node 108.

The device 1 comprises a read circuit 110 ("LECT"). The circuit 110 (delimited by a dotted frame in FIG. 1) is configured to provide an output signal OUT of the device 1. More specifically, the circuit 110 is configured to provide a pulse at each avalanche in the diode 100. In other words, at each avalanche in the diode 100, the circuit 110 is configured so that the signal OUT switches from a first state, for example the low state, to a second state, for example the high state, then, after a given duration, so that the signal OUT switches from the second state to the first state. An input terminal 112 of the read circuit 110 is connected to the node 108.

According to an embodiment, the circuit 110 receives a low supply potential VL, the potential VL being, like the potential VH, referenced to ground GND. The concept of low potential VL and high potential VH is a relative notion of these two potentials with respect to each other, the potential VL being lower than the potential VH. The circuit 110 is connected between a third rail 114 for applying the potential VL and the rail 106. In other words, a supply terminal 116 of the circuit 110, for example a high supply terminal, is connected to the rail 114, a further supply terminal 118 of the circuit 110, for example a low supply terminal, being connected to the rail 106. The potential VL is, for example, positive, for example in the order of 1.1 V.

According to an embodiment, the circuit 110 comprises a logic gate 120, in some embodiments an inverter, comprising an input coupled, in some embodiments connected, to the terminal 112, thus to the node 108, and an output 122 configured to provide the signal OUT and corresponding to the output terminal of the circuit 110. The gate 120 comprises first and second supply terminals, for example respectively high and low, coupled, in some embodiments connected, to the respective supply terminals 116 and 118 of the read circuit 110.

According to an embodiment, the circuit 110 is configured to modify the duration, or width, of the pulse of the signal OUT, as a function of a value of a pulse-duration adjustment potential VB. The potential VB here is referenced to ground GND and is, for example, comprised between the potential VL and 0 V. In some embodiments, the circuit 110 thus comprises a MOS transistor 124, in some embodiments a P-channel MOS transistor, connected between the terminal 116 and the node 108, the gate of the transistor 124 being configured to receive the potential VB. The value of the potential VB and the transistor 124 allow the duration of the pulses of the signal OUT to be fixed. In this example, the lower the value of the potential VB, the shorter the pulse.

The device 1 comprises a control circuit 126 ("CTRL") for controlling the switch 102. The circuit 126 is configured to control the opening of the switch 102 in response to the beginning of a pulse of the signal OUT (switching of the signal OUT from its first state to its second state) and to control the closing of the switch 102 in response to the end of the pulse (switching of the signal OUT from its second state to its first state). An input terminal 128 of the circuit is coupled, in some embodiments connected, to the output terminal 122 of the circuit 110. An output terminal 130 of the circuit 126 is configured to provide a control signal cmd for controlling the switch 102, the terminal 130 being coupled, in some embodiments connected, to the control terminal of the switch 102. More specifically, the circuit 126 is configured to switch the signal cmd from a first state for which the switch 102 is closed, for example the high state, to a second state for which the switch 102 is open, for example the low state, in response to the beginning of a pulse of the signal OUT, and, conversely, to switch the control signal for controlling the switch 102 from the second state to the first state in response to the end of the pulse of the signal OUT.

According to an embodiment, the circuit 126 receives the supply potential VL. In other words, the circuit 126 is connected between the rails 114 and 106. In still other words, a supply terminal 132 of the circuit 126, for example a high supply terminal, is connected to the rail 114, a further supply terminal 134 of the circuit 126, for example a low supply terminal, being connected to the rail 106.

According to an embodiment, the circuit 126 comprises a logic gate 136, an inverter in the illustrated example, comprising an input coupled, in some embodiments connected, to the terminal 128, and an output coupled, in some embodiments connected, to the terminal 130, the output of the gate 136 being configured to provide the signal cmd. The gate 136 comprises first and second supply terminals, for example respectively high and low, coupled to the respective supply terminals 132 and 134.

According to an embodiment, the circuit 126 is configured to control, or modify, the slope of the signal cmd as a function of the value of a slope adjustment potential VC, during a switching of the signal cmd causing a switching of the switch 102 to the closed state. In some embodiments, the circuit 126 thus comprises a MOS transistor 140, in some embodiments a P-channel MOS transistor, connected between the supply terminal 132 of the circuit 126 and the corresponding supply terminal of the gate 136 of the circuit 126, i.e., the supply terminal of the gate 136 configured to receive the level of potential corresponding to the second state of the signal cmd. Thus, the lower the value of the potential VC with respect to that of potential VL, for example the closer the value of the potential VC to 0 V, the steeper the slope of the signal cmd during a switching to its first state, and the faster the switch 102 switches to its closed state.

The prevision of a relatively weak slope, for example in the order of 0.1 V/ns$^{-1}$, during a switching of the signal cmd allows a progressive closing of the switch 102, which avoids triggering undesired, or untimely, avalanches in the diode 100 when the latter is being placed back in Geiger condition. This further allows to limit the disturbance at node 108, and thus to avoid false detections by the circuit 110. Moreover, by reducing the slope of this switching of the signal cmd, the delay between the end of a pulse of the signal OUT on the terminal 128 and the corresponding closing of the switch 102 is increased.

According to an embodiment, the device 1 comprises a circuit 142 configured to limit the maximum level of the potential on the anode of the diode 100. In this example, the circuit 142 is a diode 142 connected between the anode of the diode 100 and a node 144 for applying an intermediate supply potential VI referenced at ground GND, and in some embodiments, positive. The concept of high potential VH, low potential VL and intermediate potential VI is a relative notion of these potentials with respect to each other, the potential VI being comprised between the potentials VH and VL. The anode of the diode 142 is in some embodiments connected to the anode of the diode 100 and the cathode of the diode 142 is in some embodiments connected to the node 144. The potential VI is, for example, positive, for example in the order of 7 V.

The provision of the circuit 142 allows to prevent the voltage at the terminals of the switch 102 in the open state from reaching values capable of causing the destruction of the switch 102, in this example the destruction of the transistor 102.

According to an embodiment, the device 1 comprises a capacitor CA connected between the anode of the diode 100 and the rail 106.

The operation of the device 1 will now be described in relation to FIGS. 2 to 5, each of FIGS. 2 to 5 depicting the operation of a different embodiment of the device 1.

FIG. 2 illustrates time charts A and B depicting the operation of an embodiment of the device shown in FIG. 1. The time chart A depicts the progression of the signal OUT as a function of time t, the time chart B depicting the progression, as a function of time t, of the voltage VSPAD corresponding to the difference between the cathode potential of the diode 100 and the anode potential of the diode 100. The time charts A and B are not drawn to scale.

In FIG. 2, an embodiment of the device 1 is considered in which the value of the capacitor CA is negligible or in which the capacitor CA is omitted, i.e., an embodiment in which the anode of the diode 100 is considered to be floating when the switch 102 is open.

At a time t0, the diode 100 is in Geiger condition. In other words, the voltage VSPAD is at a value V0 greater than that of the avalanche voltage VBD of the diode 100 (as an absolute value) and no current flows in the diode 100. The value V0, for example, is substantially equals to that of the potential VH.

Moreover, the potential on the input 112 of the circuit 110 is at a high value sufficient for the signal OUT to be at a low value (first state of the signal OUT). For instance, the high value of the potential on the input 112 is at least partly determined by the ratio of the capacitors C1 and C2. The high value of the potential on the input 112 is at least partly determined by the value of the potential VB in the embodiments where the circuit 110 is configured to modify the width of the pulses of the signal VOUT as a function of the value of the potential VB.

As a result of the first state of the signal OUT on the input 128 of the circuit 126, the signal cmd is in its first state, for example the high state of the signal cmd, and the switch 102 is closed.

At a time t1 later than the t0, a photon is received by the diode 100 and causes an avalanche in the diode 100. A current flows between the rails 104 and 106, through the resistor R, the diode 100 and the closed switch 102. The voltage drop at the terminals of the resistor R causes a corresponding decrease in the cathode potential of the diode 100, thus of the voltage VSPAD to a value V1 lower (as an absolute value) than the avalanche voltage VBD. This decrease in the voltage VSPAD to the value V1 allows the avalanche in the diode 100 to be quenched. At the same time, the decrease in the cathode potential of the diode 100 causes a decrease in the potential on the input 112 of the circuit 110 to a value such that the signal OUT switches to a high value (second state of the signal OUT). This switching of the signal OUT corresponds to the beginning of a pulse of the signal OUT and the circuit 126 thus controls the opening of the switch 102, by switching the signal cmd to its second state, for example the low state of the signal cmd.

From the time t1, the cathode potential of the diode 100 gradually increases via the charge of the circuit RC comprising the resistor R and the capacitive divider bridge C1, C2.

At a time t2 later than the time t1, the cathode potential of the diode 100 reaches a value such that the value of the potential on the input 112 of the circuit 110 is sufficient for the signal OUT to switch from its second state to its first state (end of the pulse of the signal OUT). The circuit 126 thus controls the closing of the switch 102, by switching the signal cmd to its first state. From an instant t2' later than the instant t2, the switch 102 closes, in some embodiments gradually.

Between the times t1 and t2', as the switch 102 is open, the anode of the diode 100 is floating and the anode potential of the diode 100 follows the cathode potential of the diode 100. As a result, between the times t1 and t2', the voltage VSPAD remains equal to the voltage V1. The duration tquench between the times t1 and t2' is determined so as to quench or stop the avalanche phenomenon in the diode 100, and to evacuate from the diode 100 all the free carriers generated during the avalanche. Moreover, the anode of the diode 100 being floating, each new avalanche in the diode 100 is immediately aborted. This duration tquench is commonly called quench time.

As of the time t2', the anode potential of the diode 100 approaches the potential of the rail 106, in some embodiments gradually as the switch 102 closes. In the same time, the increase in the cathode potential of the diode 100 continues and the voltage VSPAD thus gradually increases until it reaches the value V0 at a time t3 later than the time t2'. As of the time t3, the diode 100 is in Geiger condition, ready to detect a new single photon. The duration tdead_time between the times t1 and t3 for placing the diode 100 back in Geiger condition after the beginning of the avalanche in the diode 100 is commonly called dead time.

In the device 1, the quench circuit of the SPAD diode 100 thus comprises the resistor R, the capacitive bridge C1, C2, the read circuit 110, the circuit 126 and the switch 102.

For the sake of comparison, a fictive device similar to the device 1 is considered, but one in which the circuit 126 and the switch 102 are omitted, and in which the anode of the diode 100 is connected to the rail 106. In such a fictive device, the quench time tquench of the diode 100 would depend solely on the time constant of the circuit RC comprising the resistor R and the capacitive divider bridge C1, C2. It would thus be possible to provide a resistor R of a value sufficient to obtain a quench time tquench identical to that of the device 1. However, that would increase the dead time tdead_time of the fictive device with respect to that of the device 1, which is not desirable.

Thus, compared to this fictive device, the device 1 allows the value of the resistor R, thus of the dead time tdead_time, to be reduced without modifying the quench time tquench. More generally, compared to a conventional passive quenching device, it is possible with the device 1 to reduce the value of the resistor R, thus of the dead time tdead_time, while still retaining the same quench time tquench. This advantage of the device 1 with respect to the conventional passive quenching devices is obtained by adding solely the switch 102 and the circuit 126, the device 1 thus remaining compact, in particular with respect to active quenching devices.

Indeed, the MOS transistor 102 of the device 1 is more compact and consumes less than transistors of the active quench circuits.

Due to its compactness and its low consumption, the device 1 is adapted to the implementation of an image sensor comprising a plurality of devices or pixels 1, in some embodiments arranged in a matrix. Moreover, in such a sensor, all the SPADs 100 of the sensor have an identical quench time tquench and an identical dead time tdead_time, with the exception of manufacturing dispersions. This results in particular from the fact that, for each pixel 1, these times tquench and tdead_time depend solely on signals generated directly in the pixel 1. In addition, in such a sensor, the reduction of the dead time tdead_time between two successive single-photon detections allows to obtain a greater dynamic than that of the image sensor in which the dead time is greater, as would be the case, for example, with a sensor comprising a plurality of fictive devices as described above.

FIG. 3 illustrates a time chart depicting the operation of a further embodiment of the device shown in FIG. 1. The time chart shown in FIG. 3 corresponds to the time chart B shown in FIG. 2 in the case of an embodiment of the device 1 where the capacitor CA has a non-negligible value. In other words, the time chart shown in FIG. 3 corresponds to an embodiment of the device 1 in which, when the switch 102 is open, the variations in the anode potential of the diode 100 depend on the value of the capacitor CA. Only the differences in operation between these embodiments of the device 1 are highlighted here.

Compared to what was described in relation to the time chart B shown in FIG. 2, in FIG. 3, the anode potential of the diode 100 increases between the times t1 and t2'. More specifically, the anode potential of the diode 100 increases less rapidly than the cathode potential of the diode 100, those skilled in the art being capable of selecting the dimensions of the various capacitors CA, C1 and C2 of the device 1 in order to obtain this operation. As an example, the capacitor CA has a value between 0.1 times and 10 times the value of the internal capacitance of the diode 100.

Thus, between the times t1 and t2', the voltage VSPAD increases from the value V1 lower than that of the avalanche voltage VBD (as an absolute value), until a value V2.

In some embodiments, the value V2 is greater than the voltage VBD (as an absolute value) and lower than the value V0, and is, for example, equal to (V0+VBD)/2 plus or minus (V0−VBD)/4.

The provision of a value V2 greater than that of the voltage VBD allows a faster evacuation of the free carriers generated in the diode 100 during the avalanche. This provision of the value V2 greater than that of the voltage VBD further allows to ensure that all the free carriers generated in the diode 100 are evacuated, even in the case where the diode 100 tends to store carriers because of its internal structure. The quench time tquench, thus the dead time tdead_time, can thus be reduced with respect to the case shown in FIG. 2, this reduction being, for example, implemented by modifying the value of the potential VC and/or the value of the potential VB. Those skilled in the art are capable of determining the duration tquench to quench the avalanche in the diode 100 and empty the diode 100 of its free carriers generated during the avalanche.

Furthermore, between instants t1 and t2', the anode of the diode 100 being connected to the rail 106 by the low capacitor CA, any new avalanche in the diode 100 would involve only weak currents, and thus slight variations in the potential of the node 112. Therefore, between the instants t1 and t2', a new avalanche would not be detected by the read circuit 110, but it would contribute to the evacuation of the free carriers present in the diode 100.

FIG. 4 illustrates a time chart depicting the operation of still another embodiment of the device shown in FIG. 1. The time chart shown in FIG. 4 corresponds to the time chart shown in FIG. 3 in the case of an embodiment of the device 1 where the capacitor CA has a non-negligible value and the resistance of the switch or transistor 102 in the on state has a value different from zero, for example comprised between 0.1 and 10 times the value of the resistor R. Only the differences in operation between the devices 1 corresponding to the respective FIGS. 3 and 4 are highlighted here.

In FIG. 4, at the time t1, the decrease in the voltage VSPAD from the value V0 to the value V1 results not only in the voltage drop across the resistor R, but also in the voltage drop across the closed switch 102.

Then, as soon as the switch 102 opens, the cathode potential of the diode 100 increases, the anode potential of the diode 100 also increasing, but less rapidly than the cathode potential. The voltage VSPAD thus increases until it reaches the value V2 at a time t1' later than the time t1 but before the time t2 corresponding to the end of the pulse of the signal OUT. From the time t1' up to the time t2', the voltage VSPAD is constant and equal to the value V2. This results from the fact that the amplitude of the increase in the voltage VSPAD when the switch 102 is open is limited by the value of the voltage drop across the resistor R at the moment of the avalanche, and from the fact that this value is lower in the case shown in FIG. 4 than in the case shown in FIG. 3.

Compared to the case shown in FIG. 3, the embodiment of the device 1 described in relation to FIG. 4 allows a better control of the value V2 and of the duration during which the diode 100 is biased at the value V2. This allows to avoid that the potential difference between the terminals of the diode 100 becomes too close to the value V0 between the instants t1' and t2'. In other words, compared to the case shown in FIG. 3, it is possible with the embodiment of the device 1 described in relation to FIG. 4 to decrease the probability that the diode 100 enters into avalanche in an untimely fashion.

Those skilled in the art are capable of choosing the value of the resistor R and the value of the on-state resistance of the switch or transistor 102, by dimensioning in consequence this switch or transistor 102, to obtain a target value V2.

In variant embodiments described in the following, it is desirable to be able to deactivate the device 1 described in relation to FIGS. 1 to 4, in particular when the latter is used as a pixel of an image sensor. Indeed, it is possible by this means to reduce the consumption of a system, for example an image sensor, comprising the device 1 during phases of operation when the device 1 is not used. Moreover, in the particular case of an image sensor comprising a plurality of pixels 1, for example arranged in a matrix, it is possible by this means to deactivate the one or more defective pixels 1.

In these variant embodiments, in order to deactivate the device 1, it is provided to interrupt the conductive path coupling the diode 100 to the rail 106 by means of the switch 102. This interruption of the conductive path is conditioned by the state of a deactivation signal EN for deactivating the device 1. More specifically, it is provided to interrupt this conductive path for as long as the signal EN is in a first state.

Such variants of the device 1 will now be described in relation to FIGS. 5 and 6, only the differences between the devices 1 shown in FIGS. 5 and 6 and the device 1 shown in FIG. 1 being highlighted here.

Figure 5:
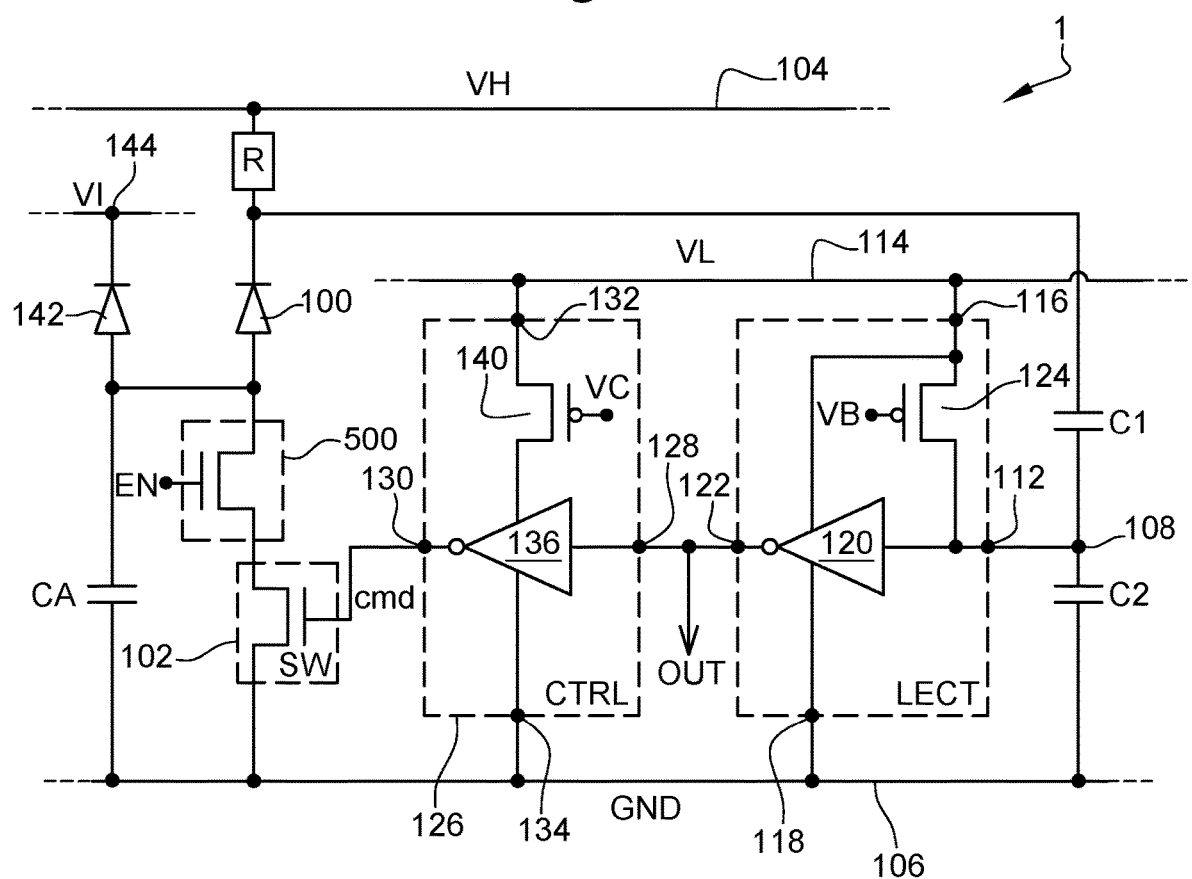
FIG. 5 illustrates a variant embodiment of the device shown in FIG. 1.

FIG. 5 depicts a variant embodiment in which, in order to interrupt the conductive path coupling the diode 100 to the rail 106 via the switch 102, the device 1 comprises an additional switch 500.

The switch 500 is in some embodiments a MOS transistor 500, in some embodiments an N-channel MOS transistor 500. The switch 500 is connected in series with the switch 102, between the diode 100 and the rail 106. Moreover, the switch 500 is controlled by the signal EN, a control terminal of the switch 500, for example the gate of the MOS transistor 500, being configured to receive the signal EN. The switch 500 is configured to be open when the signal EN is in a first state, and closed when the signal EN is in a second state.

In the example shown in FIG. 5, the switch 500 is connected between the diode 100 and the switch 102. In other words, a conduction terminal of the switch 500, for example the drain of the transistor 500, is coupled, in some embodiments connected, to the diode 100, more specifically to the anode of the diode 100, and a further conduction terminal of the switch 500, for example the source of the transistor 500, is coupled, in some embodiments connected, to a conduction terminal of the switch 102, for example the drain of the transistor 102.

In a further example that is not illustrated, the switch 500 is connected between the switch 102 and the rail 106. In other words, a conduction terminal of the switch 500, for example the drain of the transistor 500, is coupled, in some embodiments connected, to a conduction terminal of the switch 102, for example the source of the transistor 102, and a further conduction terminal of the switch 500, for example the source of the transistor 500, is coupled, in some embodiments connected, to the rail 106.

The choice of the position of the switch 500 with respect to the switch 102 is, for example, determined by the level of potential available for the first state of the signal EN. For example, in the case where it is desired to put on standby a system such as an image sensor comprising a plurality of pixels 1, for example arranged in a matrix, so as to reduce to the greatest extent possible the consumption of the system, this level of potential can have a value very close to the threshold voltage of the transistor 500, for example in the order of 0.7 V, and the switch 500 is thus in some embodiments disposed on the side of the rail 106 rather than on the side of the diode 100. Conversely, when the value of the potential VL is relatively close to the threshold voltage of the transistor 102, it is desirable that the switch 500 is disposed on the side of the diode 100, and that the level of potential corresponding to the first state of the signal EN is adapted accordingly.

Figure 6:
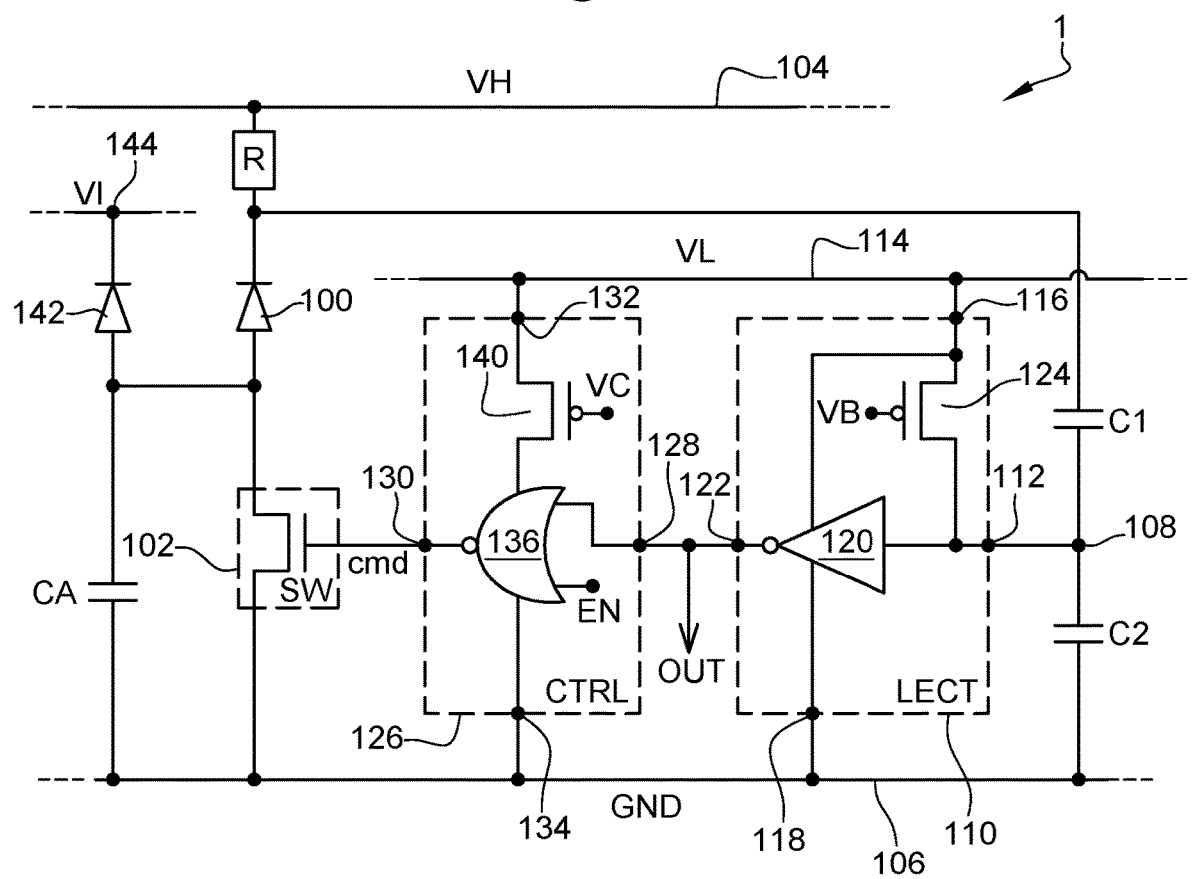
FIG. 6 illustrates a further variant embodiment of the device shown in FIG. 1.

FIG. 6 depicts a variant embodiment in which the read circuit 126 is configured to interrupt the conductive path coupling the diode 100 to the rail 106 via the switch 102 for as long as the signal EN is in a first state. In other words, the circuit 126 is configured to keep the switch 102 open for as long as the signal EN is in its first state.

More specifically, in FIG. 6, the gate 136 of the circuit 126, for example a NOR gate, comprises an additional input configured to receive the signal EN in addition to the input coupled, in some embodiments connected, to the input 128 of the circuit 126. The gate 136 is configured to maintain the signal cmd in its first state (open switch 102), for as long as the signal EN is in its first state.

It should be noted that, compared to the variant embodiment of FIG. 5 in which, in some embodiments, the first and second states of the signal EN correspond to the respectively low and high states of the signal EN, in the particular variant embodiment shown in FIG. 6 where the gate 136 is a NOR gate, the first and second states of the signal EN correspond to the respectively high and low states of the signal EN. For instance, the high state of the signal EN corresponds to a potential substantially equal to the potential VL, the low state signal EN corresponding, for example, to the potential GND.

In a further variant embodiment not illustrated, when the signal EN is in its first state, the conductive path coupling the diode 100 and the rail 106 via the switch 102 is interrupted by the circuit 126 by forcing the potential VC to a value such that the MOS transistor 140 is off. In other words, the signal VC is either used as an analogue signal the value of which conditions the slope of the signal cmd during a switching to the first state of the signal cmd, or as a digital signal controlling the switching to the off state of the transistor 140.

In this case, after a switching to the second state of the signal cmd (open switch 102), for as long as the MOS transistor 140 is kept off by the signal VC, a switching to the first state of the signal is not possible. In other words, the signal VC is at a value such that the slope of the signal cmd is zero during a switching from its second state to its first state.

In yet another variant not illustrated for which the circuit 126 is not configured to control the slope of the signal cmd during switching causing the closing of the switch 102, the transistor 140 is controlled solely by the signal EN, in a manner similar to what has been described above.

In further variant embodiments described in the following, it can also be desirable to deactivate solely the circuit 126 of the device 1 described in relation to FIGS. 1 to 6. In these variants, the circuit 126 is thus configured to keep the switch 102 closed for as long as a deactivation signal ACT for deactivating the circuit 126 is in a first state.

Such variants of the device 1 will now be described in relation to FIGS. 7 and 8, only the differences between the devices 1 shown in FIGS. 7 and 8 and the device 1 shown in FIG. 1 being highlighted here.

Figure 7:
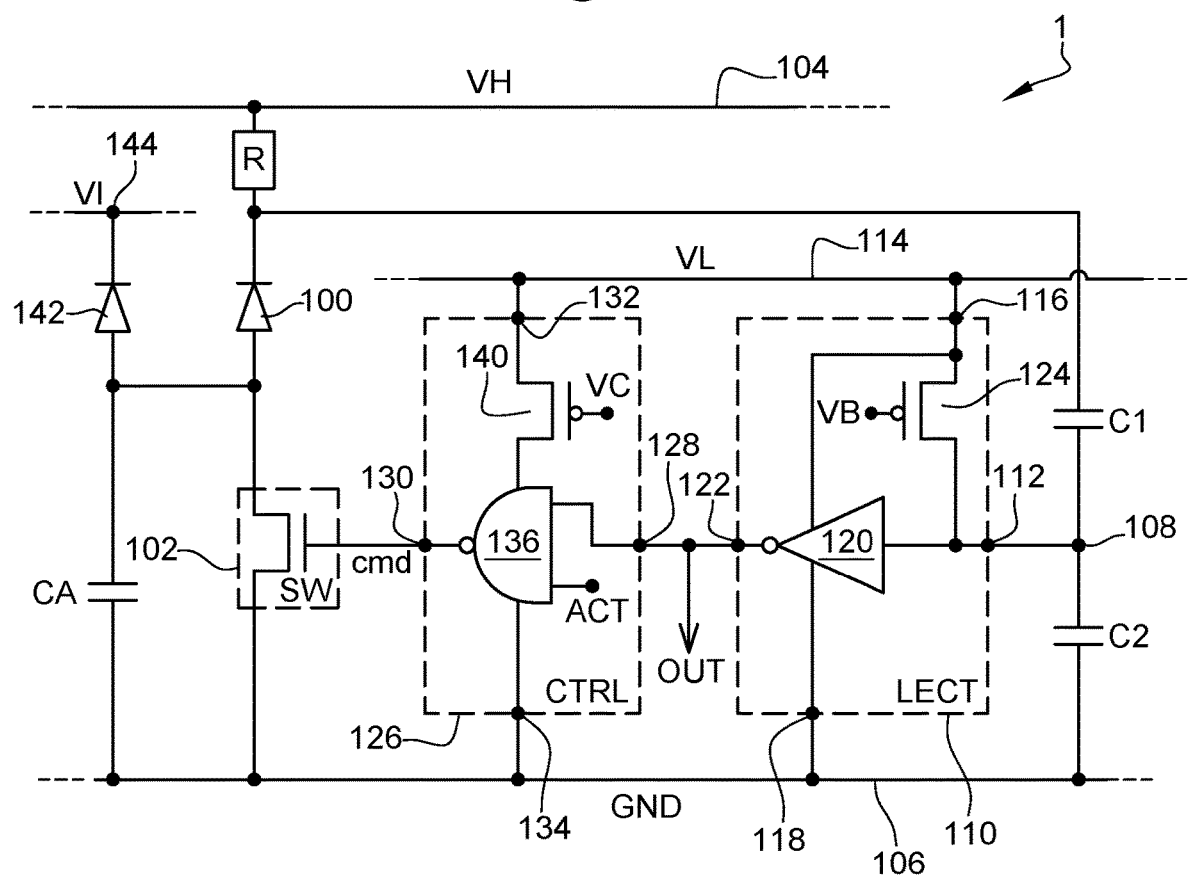
FIG. 7 illustrates still a further variant embodiment of the device shown in FIG. 1.

FIG. 7 depicts a variant embodiment in which the gate 136 of the circuit 126, for example a NAND gate, comprises an additional input configured to receive the signal ACT in addition to the input coupled, in some embodiments connected, to the input 128 of the circuit 126. The gate 136 is configured to maintain the signal cmd in its first state (closed switch 102), for as long as the signal ACT is in its first state. In the example shown in FIG. 7, the first state of the signal ACT corresponds to a low state of the signal ACT, for example to the potential GND.

Figure 8:
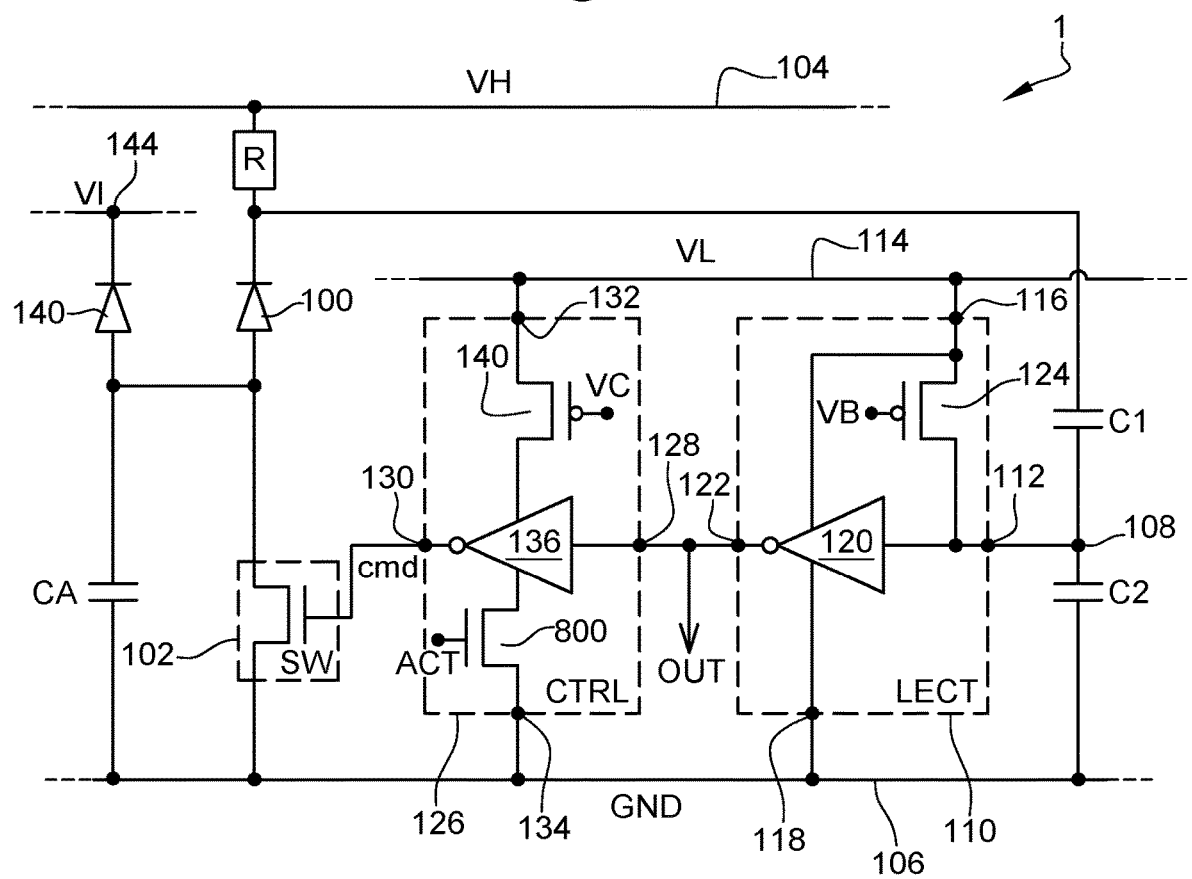
FIG. 8 illustrates still a further variant embodiment of the device shown in FIG. 1.

FIG. 8 depicts a variant embodiment in which the circuit 126 comprises a MOS transistor 800, for example an N-channel MOS transistor. The transistor 800 is connected between the terminal 134 of the circuit 126 and a corresponding supply terminal of the gate 136, i.e., the supply terminal of the gate 136 configured to receive the level of potential corresponding to the second state of the signal cmd (open switch). For example, the drain of the transistor 800 is connected to this supply terminal of the gate 136, and the source of the transistor 800 is connected to the terminal 134 of the circuit 126.

The transistor 800 is controlled by the signal ACT, its gate being configured to receive the signal ACT. The transistor 800 is further configured to be open for as long as the first state of the signal ACT, for example the low state of the signal ACT, is applied on its gate. Thus, for as long as the MOS transistor 800 is kept off by the first state of the signal ACT, a switching to the second state of the signal cmd is not possible and the switch 102 remains closed.

Various embodiments and variants have been described. Those skilled in the art will understand that certain features of these embodiments can be combined and other variants will readily occur to those skilled in the art. In particular, the embodiments in which the read circuit 126 can be deactivated can be combined with the embodiments in which the device 1 can be deactivated. Those skilled in the art are capable of implementing these combinations, in particular by modifying the gate 136 of the device 1, for example by providing a logic gate 136 comprising three inputs configured to receive the respective signals OUT, ACT and EN.

More generally, those skilled in the art can implement the functions of the circuit 126 described above by using logic gates 136 other than those described in relation to the respective FIGS. 1 and 5 to 8, in particular a logic gate corresponding to a combination of a plurality of elementary OR, AND, NOR, NAND, XOR, inverting, etc., logic gates.

Furthermore, it will be understood that each of the capacitors CA, C1 and C2 may correspond to one or more capacitive components, to one or more intrinsic capacitances of the circuit, or to a combination of one or more capacitive components with one or more intrinsic capacitances of the circuit. Similarly, the resistor R may correspond to one or more resistive components, to the equivalent resistance of an electrical conductor between the rail 104 and the node 108, or to a combination of one or more resistive components with the equivalent resistance of the electrical conductor between the rail 104 and the node 108.

Further, although it was previously indicated that the signal OUT is the output signal of the device 1, another signal of the device could be used as an output signal. For example, the output signal of the device 1 can correspond to the output of an inverter the input of which being coupled, for example connected, to the anode of the photodiode 100.

Finally, the practical implementation of the embodiments and variants described herein is within the capabilities of those skilled in the art based on the functional description provided hereinabove.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a photodiode having a first terminal and a second terminal;
a resistor coupled between the first terminal of the photodiode and a first rail configured to receive a high supply potential;
a switch coupled between the second terminal of the photodiode and a second rail configured to receive a reference potential;
a read circuit configured to provide a pulse when the photodiode enters into avalanche; and
a control circuit configured to control an opening of the switch in response to a beginning of said pulse and to control a closing of the switch in response to an end of said pulse,
wherein the control circuit includes a logic gate having an input configured to receive said pulse and an output configured to provide a control signal to the switch,
wherein the control circuit is further configured to control a slope of the control signal as a function of a value of a slope adjustment potential, during a switching of the control signal causing a closing of the switch,
wherein the control circuit includes a MOS transistor connected between a supply terminal of the control circuit and a first supply terminal of the logic gate of the control circuit, a gate of the MOS transistor being configured to receive the slope adjustment potential.

2. The device according to claim 1, wherein the switch is a MOS transistor.

3. The device according to claim 1, configured to interrupt a conductive path coupling the second terminal of the photodiode to the second rail via the switch for as long as a deactivation signal for deactivating the device is in a first state.

4. The device according to claim 3, further comprising:
an additional switch connected in series with said switch between the second terminal of the photodiode and the second rail, the additional switch configured to deactivate the device in response to the deactivation signal.

5. The device according to claim 3, wherein the input of the logic gate of the control circuit is configured to receive the deactivation signal for deactivating the device.

6. The device according to claim 1, wherein the control circuit is further configured to keep the switch closed for as long as a deactivation signal for deactivating the control circuit is in a first state, the logic gate of the control circuit including an input configured to receive the deactivation signal for deactivating the control circuit.

7. The device according to claim 1, wherein the gate of the MOS transistor is configured to receive a deactivation signal for deactivating the control circuit.

8. The device according to claim 1, further comprising a capacitive bridge divider connected between the first terminal of the photodiode and the second rail, an input terminal of the read circuit being connected to an intermediate node of the capacitive divider bridge.

9. The device according to claim 8, wherein the read circuit is further configured to modify a duration of the pulse as a function of a value of a pulse-duration adjustment potential.

10. The device according to claim 9, wherein the read circuit includes a MOS transistor connected between a supply terminal of the read circuit and the intermediate node, a gate of the MOS transistor being configured to receive the pulse-duration adjustment potential.

11. The device according to claim 8, wherein the read circuit includes a logic gate having an input terminal coupled to the intermediate node, and an output terminal configured to provide said pulse.

12. The device according to claim 1, wherein the read circuit and the control circuit are each connected between the second rail and a third rail configured to receive a low supply potential.

13. The device according to claim 1, further comprising a potential-limiting circuit configured to limit a maximum level of potential on the second terminal of the photodiode, the potential-limiting circuit including an additional photodiode connected between the second terminal of said photodiode and a node configured to receive an intermediate supply potential.

14. The device according to claim 1, further comprising a capacitor connected between the second terminal of said photodiode and the second rail.

15. An image sensor, comprising:
a plurality of devices arranged in a matrix of pixels of the image sensor, each of the plurality of devices including:
a photodiode having a first terminal and a second terminal;
a resistor coupled between the first terminal of the photodiode and a first rail configured to receive a high supply potential;
a switch coupled between the second terminal of the photodiode and a second rail configured to receive a reference potential;
a read circuit configured to provide a pulse when the photodiode enters into avalanche; and
a control circuit configured to control an opening of the switch in response to a beginning of said pulse and to control a closing of the switch in response to an end of said pulse,
wherein the control circuit includes a logic gate having an input configured to receive said pulse and an output configured to provide a control signal to the switch, and a MOS transistor connected between a supply terminal of the logic gate of the control circuit and the second rail, a gate of the MOS transistor being configured to receive a deactivation signal for deactivating the control circuit.

16. The image sensor of claim 15, wherein the read circuit and the control circuit are each connected between the second rail and a third rail configured to receive a low supply potential.

17. The image sensor of claim 15, wherein each of the plurality of devices is configured to interrupt a conductive path coupling the second terminal of the photodiode to the second rail via the switch for as long as a deactivation signal for deactivating the device is in a first state.

18. The image sensor of claim 17, wherein each of the plurality of devices further includes:
an additional switch connected in series with said switch between the second terminal of the photodiode and the second rail, the additional switch configured to deactivate the device in response to the deactivation signal.

19. The image sensor of claim 17, wherein input of the logic gate of the control circuit is configured to receive the deactivation signal for deactivating the device.

20. The image sensor of claim 15, wherein the control circuit is further configured to keep the switch closed for as long as a deactivation signal for deactivating the control circuit is in a first state, the logic gate of the control circuit including an input configured to receive the deactivation signal for deactivating the control circuit.

* * * * *